United States Patent [19]

Gerstenberg

[11] Patent Number: 5,495,209
[45] Date of Patent: Feb. 27, 1996

[54] SWITCHED-INVERTER MODULATOR FOR PRODUCING MODULATED HIGH VOLTAGE PULSES

[75] Inventor: John W. Gerstenberg, Lake Elsinore, Calif.

[73] Assignee: Hughes Missile Systems Company, Los Angeles, Calif.

[21] Appl. No.: 422,282

[22] Filed: Apr. 14, 1995

[51] Int. Cl.$^6$ .................................................. H03K 7/10
[52] U.S. Cl. ........................ 332/108; 307/107; 307/108; 331/87; 332/109; 332/112; 332/115; 342/204; 375/238; 375/239
[58] Field of Search .................................. 332/106, 108, 332/109, 112, 115; 375/238, 239; 307/106, 107, 108; 342/202, 203, 204; 331/87

[56] References Cited

U.S. PATENT DOCUMENTS 4,827,267 5/1989 Shearin ...................................... 331/82
5,053,682 10/1991 Shoda et al. ............................... 331/87

*Primary Examiner*—Siegfried H. Grimm
*Attorney, Agent, or Firm*—Charles D. Brown; Randall M. Heald; Wanda K. Denson-Low

[57] ABSTRACT

A switched-inverter modulator for use in driving a load that comprises master and slave high voltage power supplies for providing output pulses that directly drive the load. A synchronized pulse generator provides pulse width tinting and synchronized amplitude commands to the master power supply. The timing pulse instructs the power supplies when to initiate high voltage and for what time interval. The analog waveform instructs the master power supply as to what high voltage level to obtain. The master power supply may have multiple slaves connected in parallel for additional current capacity. A low voltage DC capacitor bank is connected in parallel with each of the power supplies to supplement energy storage. Isolation resistors are coupled between outputs of the respective high voltage power supplies and the load to minimize temporary shorts from ringing back into the power supplies. A ramp generator is provided for synchronizing timing pulses with corresponding amplitude commands, and for controlling the rise time of each power supply. The switched-inverter modulator is capable of varying pulse widths, pulse repetition frequencies, and amplitude output applied to the load, and complex radio frequency pulse trains may be created. The present invention provides for the smallest, lightest, and most versatile pulse modulator available using current state-of-the-art technology to drive the load, and in particular a magnetron.

9 Claims, 3 Drawing Sheets

SWITCHED-INVERTER MODULATOR FOR PRODUCING MODULATED HIGH VOLTAGE PULSES

BACKGROUND

The present invention relates to modulators, and more particularly, to switched-inverter modulators for use in driving magnetrons and microwave tubes, and the like.

Most high energy pulse power devices require some type of high voltage modulation scheme to drive them. The conventional techniques used are L-C line-type, hard tube or semi-hard tube modulators. The present invention was developed to minimize system size and weight and maximize power efficiency while incorporating waveform agility into the modulator design. Consequently, what was required was the efficiency of a line-type modulator, pulse width and PRF (pulse repetition frequency) versatility of a hard tube modulator, and a third very important parameter, the ability to provide time varying amplitude that is not provided by the conventional modulators.

There are three types of modulators that are conventionally used to drive high power microwave tubes, for example, which include line-type, hard-tube (or semi-hard tube), and modulating anode/grid modulators. The present invention does not employ modulating anodes or grids and these types of modulators will therefore not be discussed herein.

Line-type modulators are very efficient and use voltage doubling resonance effects of an L-C network driving an impedance matched load such as a microwave tube by way of a pulse transformer. L-C networks are PRF limited due to the slow recovery time of a thyratron. Also, pulse widths are generally limited to the microsecond region due to the enormous size and weight of a PFN (pulse forming network) used in line-type modulators. The line-type modulator, when driving a radio frequency (RF) magnetron for example, is not particularly amplitude variable pulse-to-pulse and therefore was an unlikely candidate for the application.

Hard-tube modulators are pulse width and PRF versatile, but again have their limitations. Hard tubes require more heating and biasing power than the line-type modulator. Hard tubes are lossy and are considered temperamental. Although higher PRFs than a line-type modulator can usually be achieved, the switch tubes tend to be pulse width limited, typically in the short microsecond region. In typical capacitively coupled hard tube modulators, amplitude modulation is not easily achieved. Issues of droop verses amplitude variation become a concern.

Semi-hard-tube modulators (modified hard-tube design) incorporate a device known as a Crossatron used in place of a vacuum tube. The Crossatron is more efficient and allows pulse widths to be extended to the millisecond region. However, this modulation scheme lacks versatile amplitude modulation capability. The waveform of the semi-hard-tube modulator has longer pulses in the millisecond region in addition to the narrow pulse widths. The PRF is also varied while maintaining constant amplitude pulses.

Therefore, it is an objective of the present invention to provide for an improved switched-inverter modulator for use in driving magnetrons and microwave tubes, and the like, that overcome the limitations of conventional modulators.

SUMMARY OF THE INVENTION

In order to meet the above and other objectives, the present invention is a switched-inverter modulator for use in driving a load. The modulator comprises a synchronized pulse generator for providing pulse width timing and synchronized amplitude commands. Master and slave high voltage power supplies are provided for providing output pulses that drive the load. Low voltage DC capacitors are connected in parallel with each of the power supplies to supplement the energy storage required for a pulse. Isolation resistors are coupled between outputs of the high voltage power supplies and the load for minimizing temporary shorts from ringing back into the power supplies. A ramp generator is coupled to the master power supply for synchronizing timing pulses with corresponding amplitude commands, and for controlling the rise time of each power supply.

The synchronized pulse generator delivers pulse width timing and synchronized amplitude commands to the high voltage switching power supplies while the output voltage pulse is delivered directly to a continuous wave magnetron oscillator, for example. The power supplies are isolated with power resistors to prevent disruptive magnetron arc reflections. The switched-inverter modulator is capable of varying pulse widths, pulse repetition frequencies, and amplitude output. Complex radio frequency pulse trains may be created.

The modulator may be employed with an RF transmitter having small system size and weight and maximum power efficiency, and provides waveform agility. The present modulator pulse modulates a CW magnetron while providing user-friendly variability of pulse width, PRF, and amplitude waveforms. The key advantages of the modulator are that it provides high pulse repetition rates, long pulse widths, and pulse amplitude modulation versatility. The present invention provides for the smallest, lightest, and most versatile pulse modulator available using current state-of-the-art technology to drive a magnetron, for example. The modulator may be used in long range coded radar transmitters, electronic warfare devices, or communication systems, and the like. The modulator may also be used in scientific research where unusual waveform interaction studies take place.

The high voltage power supply is a switch-mode power supply that rectifies and filters 3-phase line AC to provide a low DC voltage, chops the low DC voltage at a rate of 30 KHz, and then steps up the voltage to a desired level. The output is a combination of several series and parallel transformer taps that are rectified to a high voltage DC level. The power supplies have unique pulse widths, duty cycles, and voltage levels in accordance with the present invention. A ramp generator is incorporated into the master power supply that zero starts and synchronizes the timing pulse with its amplitude command. This ramp also controls the power supply rise time in accordance with the present invention. The master power supply may have multiple slave power supplies connected in parallel for additional current capacity.

The uniqueness of the present invention is that the load is directly driven by two power supplies. In a reduced to practice embodiment of the present invention, a magnetron is the load. In the present invention, there are no high voltage storage elements, such as the capacitors or inductors as are required in conventional modulators. This avoids high voltage breakdown issues as well as reduces safety risks. However, a low voltage DC capacitor bank is connected in parallel with the power supplies to supplement the storage energy needed during a pulse. The DC capacitor bank was used because the peak pulse power condition exceeded the prime power average output capability of the generator.

Magnetrons are notorious for having noisy turn-on characteristics such as spiking; and arcing. Therefore, isolation resistors are used to minimize temporary shorts from ringing back into the power supplies.

A pulse generator was built to deliver a timing pulse along with a synchronized analog waveform to the master high voltage power supply. The timing pulse instructs the power supplies when to initiate high voltage and for what time interval. The analog waveform instructs the master supply as to what high voltage level to obtain.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which:

FIG. 1b illustrates a typical RF pulse-train provided by the modulator of FIG. 1a;

FIG. 4b illustrates a typical RF Pulse-train having millisecond pulse widths and amplitude variation produced by the modulator of FIG. 4a; and FIG. 4c shows a detailed diagram of the switched-inverter modulator of FIG. 4a.

DETAILED DESCRIPTION

Figure 1A:
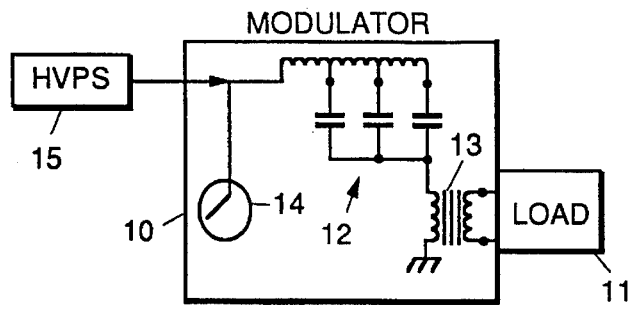
FIG. 1a illustrates a conventional generalized line-type modulator.
Figure 1B:
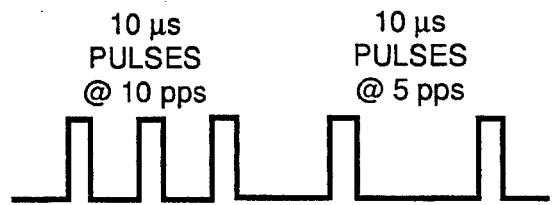
Figure 2A:
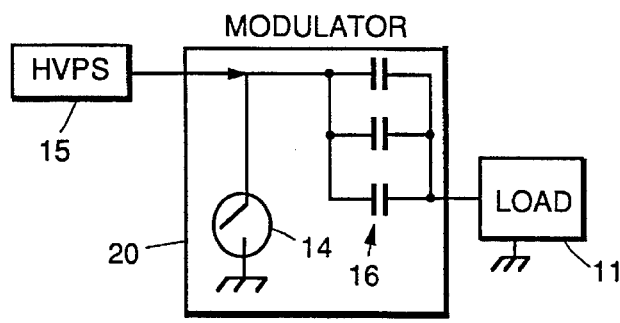
FIG. 2a illustrates a conventional generalized hard-tube modulator utilizing a capacitively coupled load.
Figure 3A:
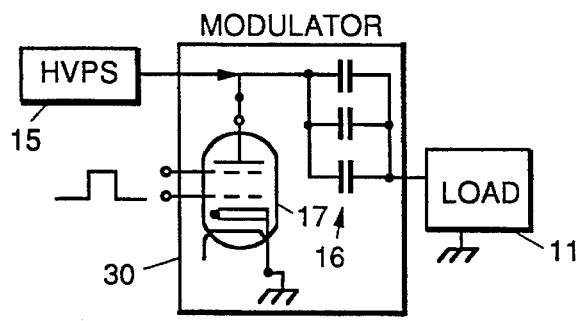
FIG. 3a illustrates a conventional semi-hard-tube modulator using a Crossatron to replace a vacuum tube

Referring to the drawing figures, and by way of introduction, FIGS. 1a, 2a, and 3a show three conventional modulators 10, 20, 30 that are used to drive a load 11, such as a high power microwave tube. A line-type modulator 10 is shown in FIG. 1a and a typical RF pulse-train provided by the line-type modulator 10 is shown in FIG. 1b. The line-type modulator 10 is driven by a high voltage power supply (HVPS) 15. A line-type modulator 10 is very efficient and uses voltage doubling resonance effects of an L-C pulse forming network 12 to drive an impedance matched load 11 such as a microwave tube by way of a pulse transformer 13. The L-C pulse forming network 12 is PRF limited due to the slow recovery time of a thyratron 14. Also, pulse widths are generally limited to the microsecond region due to the enormous size and weight of the pulse forming network 12. The line-type modulator 10, when driving a radio frequency (RF) magnetron, for example, as a load 11, does not provide amplitude variable pulse-to-pulse output.

Figure 2B:
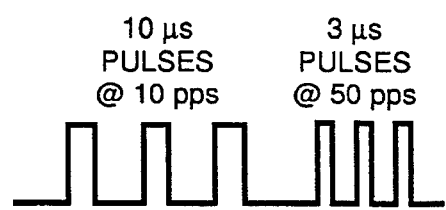
FIG. 2b illustrates a typical RF pulse-train provided by the modulator of FIG. 2a having varying microsecond pulse widths.

A hard-tube modulator 20 is shown in FIG. 2a and a typical RF pulse-train provided by the hard-tube modulator 20 is shown in FIG. 2b. The hard-tube modulator 20 is pulse width and PRF versatile, but has limitations. The hard-tube modulator 20 is driven by a high voltage power supply (HVPS) 15. The hard tubes 14 (vacuum tubes 14 or thyratrons 14), require excessive heating and biasing power. The hard tubes 14 are lossy and temperamental. Although higher PRFs than a line-type modulator can usually be achieved, the switch tubes tend to be pulse width limited, typically in the short microsecond region. In hard tube modulators that are capacitively coupled by means of a bank of capacitors 16, amplitude modulation is not easily achieved, and droop verses amplitude variation are a concern.

Figure 3B:
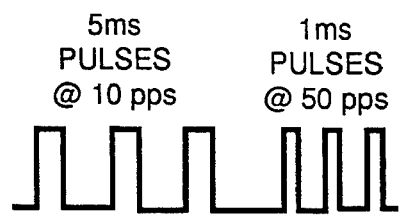
FIG. 3b illustrates a typical RF pulse-train provided by the modulator of FIG. 3a having varying millisecond pulse widths.

A semi-hard-tube modulator 30 is shown in FIG. 3a and a typical RF pulse-train provided by the hard-tube modulator 30 is shown in FIG. 3b. The semi-hard-tube modulator 30 incorporates a Crossatron 17 in place of the vacuum tube 14. The Crossatron 17 is more efficient and allows pulse widths to be extended to the millisecond region. However, the semi-hard-tube modulator 30 lacks versatile amplitude modulation capability. The output waveform of the semi-hard-tube modulator 30 has longer pulses in the millisecond region and narrow pulse widths, as is shown in FIG. 3b. The PRF is varied while maintaining constant amplitude pulses.

Figure 4A:
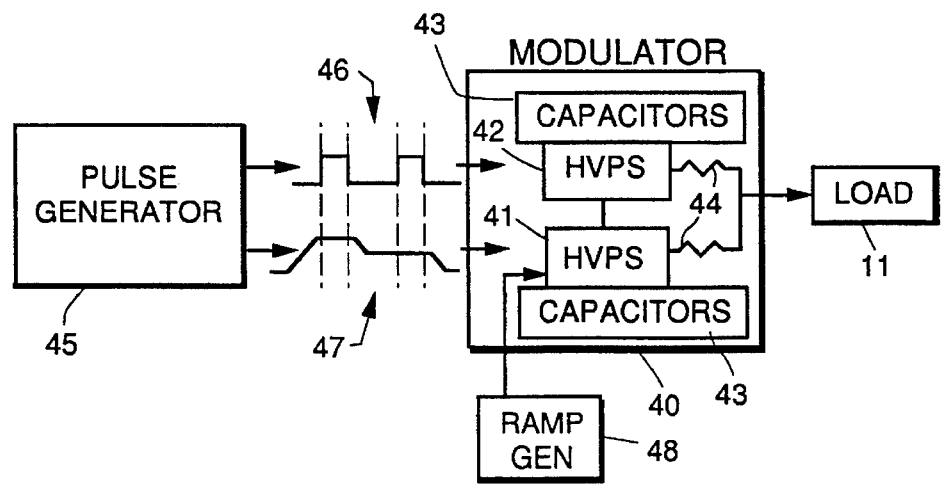
FIG. 4a illustrates a switched-inverter modulator in accordance with the principles of the present invention.
Figure 4B:
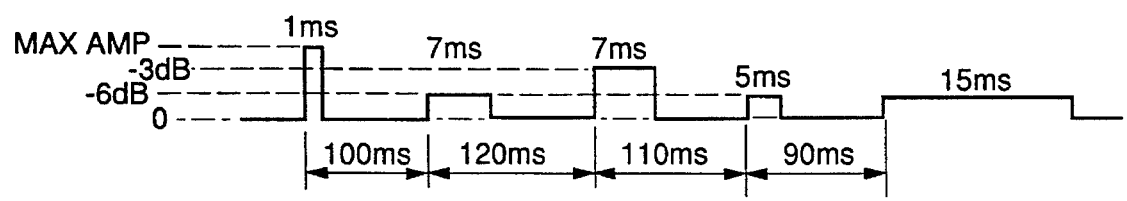
Figure 4C:
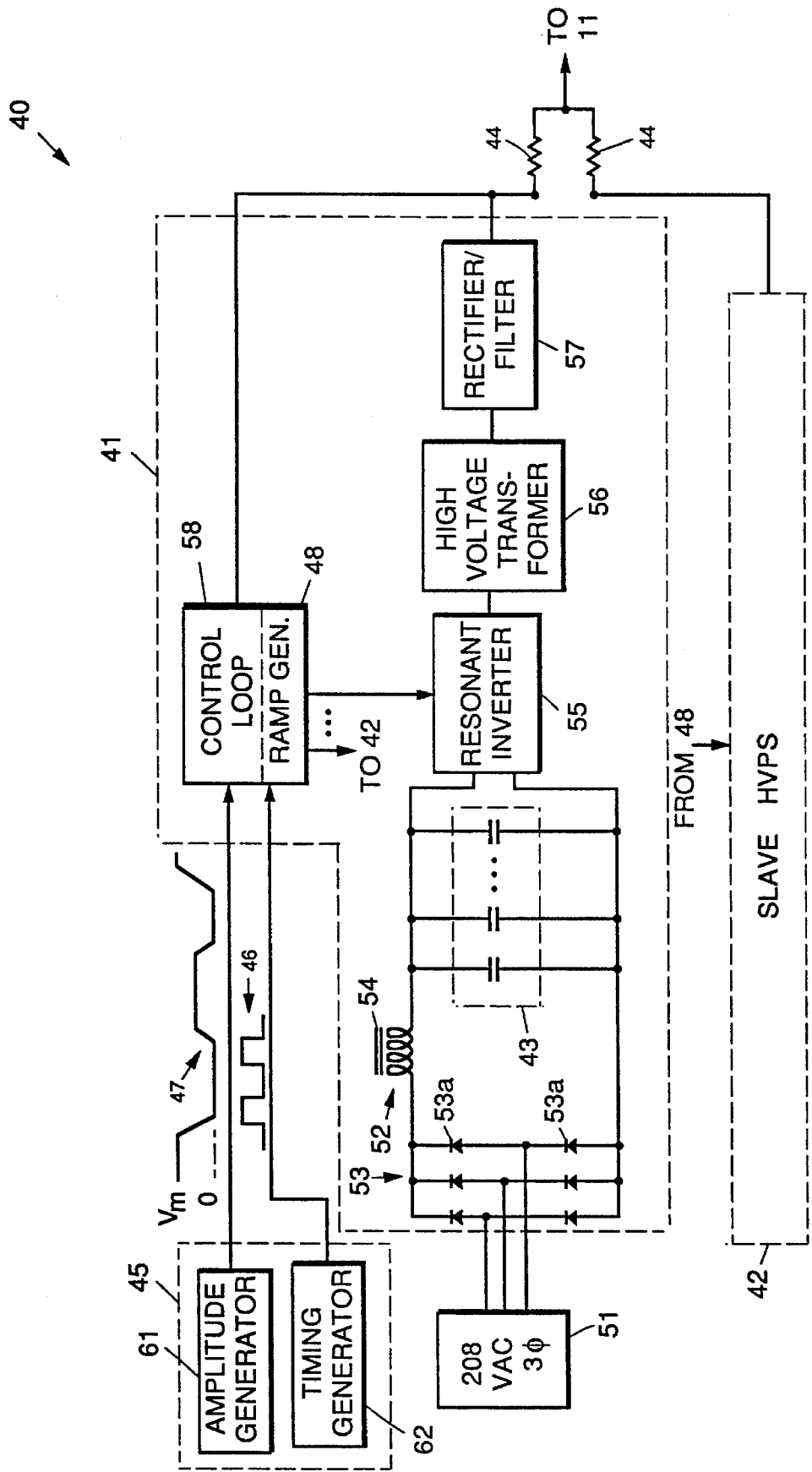

In contrast to the above-described conventional modulators 10, 20, 30, FIG. 4a illustrates a switched-inverter modulator 40 in accordance with the principles of the present invention, while FIG. 4b illustrates a typical RF pulse-train having millisecond pulse widths and amplitude variation produced by the modulator 40 of FIG. 4a. FIG. 4c shows a detailed diagram of the switched-inverter modulator 40 of FIG. 4a.

The switched-inverter modulator 40 is comprised of two high voltage power supplies (HVPS) 41, 42 comprising a master high voltage power supply 41 and a slave high voltage power supply 42. The high voltage power supplies 41, 42 are used to drive a load 11, such as a CW (continuous wave) magnetron oscillator 11, (magnetron 11), or microwave tube 11, for example. Preferentially, a magnetron 11 is used because of its high efficiency, small size and weight, and long millisecond pulse capability. A plurality of low voltage DC capacitors 43 is connected in parallel with each of the power supplies 41, 42 to supplement the storage energy needed during a pulse. Isolation resistors 44 are coupled between outputs of the high voltage power supplies and the load and are used to minimize temporary shorts from ringing back into the power supplies. A synchronized pulse generator 45 provides pulse width timing and synchronized amplitude commands 46, 47 to the high voltage switching power supplies 41, 42. A ramp generator 48 is incorporated into a master power supply 41 to zero-start and synchronize the timing pulse 46 with its amplitude command 47. The ramp generator 48 also controls the rise time of each power supply 41, 42. The master power supply 41 may have multiple slave power supplies 42 connected in parallel for additional current capacity. The output voltage pulse of the switched-inverter modulator 40 is delivered directly to the magnetron 11 by way of the isolation resistors 44.

Referring to FIG. 4c, it shows a detailed diagram of the switched-inverter modulator 40 of FIG. 4a. The switched-inverter modulator 40 includes the master and slave high voltage power supplies 41, 42 that are coupled between a 208 VAC three-phase voltage source 51, and two parallel 50 ohm isolation resistors 44 that provide a square wave output of the switched-inverter modulator 40. The high voltage power supplies 41, 42 are each comprised of a three-phase bridge rectifier 53 comprising a plurality of input diodes 53a. The bridge rectifier 53 is connected in parallel to positive and negative intputs of a DC input filter 52 which comprises the plurality of low voltage DC capacitors 43 and an inductor 54 coupled in the positive (or negative) leg between the input diodes 53 and the capacitors 43. The output of the input filter 52 is coupled to inputs of a resonant inverter 55 whose output is coupled through a high voltage transformer 56 and a rectifier/filter 57 to provide the output from the high voltage power supply 41, 42 that is coupled to the resistors 44. A control loop 58 is coupled in a feedback path from the respective outputs of the high voltage power supplies 41, 42 to control inputs of the resonant inverter 55. The control loop 58 includes the ramp generator 48. Inputs to the control loop 58 are provided by the synchronized pulse generator 45 which comprises an amplitude generator 61 and a timing generator 62.

Each high voltage power supply 41, 42 is a switch-mode power supply which rectifies and filters 3 phase line AC to provide a low DC voltage, chops the low DC voltage at a rate of 30 KHz, and then steps up the voltage to a desired level. The output is a combination of several series and parallel transformer taps that are in turn rectified to the high voltage DC level. The power supplies 41, 42 have unique pulse widths, duty cycles, and voltage levels in accordance with the present invention. The master power supply 41 and multiple slave power supplies 42 may be connected in parallel to provide for additional current capacity.

The uniqueness of the switched-inverter modulator 40 is that the load 11 (magnetron 11 or microwave tube 11) is directly driven by the two high voltage power supplies 41, 42. The switched-inverter modulator 40 has no high voltage storage elements, such as the capacitors and inductors as are required in conventional modulators 10, 20, 30. This avoids high voltage breakdown issues and reduces safety risks. However, the low voltage DC capacitors 43 are connected in parallel with the power supplies 41, 42 to supplement the storage energy needed during a pulse. The DC capacitors 43 are used because the peak pulse power condition required for the application for which the present invention was designed exceeded the prime power average output capability of the AC power source 51. The magnetrons 11 are notorious for having noisy turn-on characteristics such as spiking and arcing. Therefore, the isolation resistors 44 are used to minimize temporary shorts from ringing back into the power supplies 41, 42.

The synchronized pulse generator 45 was designed to deliver a timing pulse 46 along with a synchronized analog waveform 47 to the master high voltage power supply 41. The timing pulse 46 instructs the power supplies 41, 42 when to initiate a high voltage pulse and for what time interval. The analog waveform 47 instructs the master power supply 41 as to what high voltage level to obtain.

The switched-inverter modulator 40 was successfully tested to drive a microwave tube 11 as a load 11. The output pulse of the switched-inverter modulator 40 was used to modulate the CW (continuous wave) magnetron with user-friendly variability of pulse width, PRF, and amplitude waveforms. The design parameters for the switched-inverter modulator 40 range as shown in Table 1.

TABLE 1

| Pulse width | 0.5 to 15 ms |
|---|---|
| Pulse repetition frequency | 1 to 100 pps, >100 pps feasible |
| High voltage pulse | 0 to −18 KV |
| Peak current | 0 to 6 Amps |
| RF amplitude variation | 0 to −6 dB |
| Duty cycle | $\geq 40\%$ |

The switched-inverter modulator 40 provides for the smallest, lightest, and most versatile pulse modulator 40 available using current state-of-the-art technology to drive a magnetron 11. The switched-inverter modulator 40 may be used in scientific research where unusual waveform interaction studies take place. The switched-inverter modulator 40 may also be used in long range coded radar transmitters, electronic warfare, or communication systems, and the like.

Thus there has been described a new and improved switched-inverter modulator for use in driving a load, such as a magnetron or microwave tube, for example. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A switched-inverter modulator for use in driving a load from a voltage source, said modulator comprising:

master and slave high voltage power supplies coupled to the voltage source for providing output pulses that drive the load;

a synchronized pulse generator for providing pulse width timing and synchronized amplitude commands for the master high voltage power supply;

a control loop coupled in a feedback path from respective outputs of the high voltage power supplies and control inputs thereof, and which includes a ramp generator for synchronizing the timing pulses with corresponding amplitude commands, and for controlling the rise time of each power supply;

a plurality of low voltage DC capacitors connected in parallel with each respective power supply for providing energy storage for the output pulses; and an isolation resistor coupled between respective outputs of the high voltage power supplies and the load.

2. The modulator of claim 1 wherein the load comprises a continuous wave magnetron oscillator.

3. The modulator of claim 1 wherein the load comprises a microwave tube.

4. The modulator of claim 1 wherein the synchronized pulse generator comprises an amplitude generator and a timing generator.

5. The modulator of claim 1 wherein the master high voltage power supply comprises:

an AC bridge rectifier;

an input filter coupled to the bridge rectifier that comprises the plurality of low voltage DC capacitors;

a resonant inverter coupled to the input filter;

a high voltage transformer coupled to the resonant inverter; and a rectifier/filter coupled to the high voltage transformer for providing the output from the high voltage power supply; and wherein the control loop is coupled to control inputs of the resonant inverter.

6. The modulator of claim 1 wherein the slave high voltage power supply comprises:

an AC bridge rectifier;

an input filter coupled to the bridge rectifier that comprises the plurality of low voltage DC capacitors;

a resonant inverter coupled to the input filter;

a high voltage transformer coupled to the resonant inverter; and a rectifier/filter coupled to the high voltage transformer for providing the output from the high voltage power supply; and wherein the control loop is coupled to control inputs of the resonant inverter.

7. The modulator of claim 1 wherein inputs to the control loop are provided by the synchronized pulse generator and the ramp generator.

8. The modulator of claim 5 wherein each high voltage power supply comprises a switch-mode power supply wherein the bridge rectifier and input filter rectifies and filters three-phase line AC derived from the power source to provide a low DC voltage, the resonant inverter chops the DC voltage, and the high voltage transformer steps up the voltage to a desired high voltage DC output level, and wherein the rectifier/filter outputs the desired DC output level.

9. The modulator of claim 1 which further comprises a plurality of slave power supplies coupled in parallel with the master power supply to provide added current capacity.

* * * * *